United States Patent
Sakai et al.

(10) Patent No.: US 7,763,793 B2
(45) Date of Patent: Jul. 27, 2010

(54) THERMOELECTRIC CONVERSION MATERIAL, THERMOELECTRIC CONVERSION ELEMENT USING THE SAME, AND ELECTRONIC DEVICE AND COOLING DEVICE INCLUDING THE THERMOELECTRIC CONVERSION ELEMENT

(75) Inventors: Akihiro Sakai, Ibaraki (JP); Satoshi Okada, Kyoto (JP)

(73) Assignee: Panasonic Corporation, Osaka (JP)

( * ) Notice: Subject to any disclaimer, the term of this patent is extended or adjusted under 35 U.S.C. 154(b) by 89 days.

(21) Appl. No.: 11/976,108

(22) Filed: Oct. 22, 2007

(65) Prior Publication Data

US 2009/0165836 A1  Jul. 2, 2009

Related U.S. Application Data

(63) Continuation of application No. PCT/JP2007/050316, filed on Jan. 12, 2007.

(30) Foreign Application Priority Data

Jan. 17, 2006  (JP)  ............... 2006-008438

(51) Int. Cl.
    *H01L 35/16*  (2006.01)
(52) U.S. Cl. ............... 136/238; 136/240; 252/62.3 T
(58) Field of Classification Search ............... 136/238, 136/240; 252/62.3 T
    See application file for complete search history.

(56) References Cited

U.S. PATENT DOCUMENTS

2007/0039641 A1*  2/2007  Hu et al. ............... 136/238

FOREIGN PATENT DOCUMENTS

| JP | 8-186294 | 7/1996 |
|----|----------|--------|
| JP | 9-321346 | 12/1997 |
| JP | 2003-218411 | 7/2003 |
| JP | 2005-64407 | 3/2005 |

OTHER PUBLICATIONS

Okada, S. et al., "Thermoelectric properties of cobalt rhodium oxides: [Bi2Ba2O4]p(Co,Rh)O2" Proc. 25th Int. Conf. on Thermoelectrics. p. 422-425. (Aug. 2006).*
DiSalvo, F.J., "Thermoelectric Cooling and Power Generation". Science. 285, 703-706. (1999).*
Pelloquin, D., et al., "Partial substitution of rhodium for cobalt in the misfit $[Pb_{0.7}Co_{0.4}Sr_{1.9}O_3]^{RS}[CoO_2]_{1.8}$ oxide", Journal of Solid State Chemistry, 2005, pp. 769-775, vol. 178, Elsevier Inc.
International Preliminary Report on Patentability and Written Opinion of the International Searching Authority, issued in corresponding International Patent Application No. PCT/JP2007/050316, mailed Jul. 31, 2008.

* cited by examiner

*Primary Examiner*—Jeffrey T Barton
(74) *Attorney, Agent, or Firm*—McDermott Will & Emery LLP

(57) ABSTRACT

A thermoelectric conversion material is provided that has not only a higher thermoelectric performance as compared to conventional ones but also semiconducting temperature dependence, i.e. properties that the electrical resistivity decreases with an increase in temperature. The thermoelectric conversion material contains a substance having a layered bronze structure represented by a formula $(Bi_2A_2O_4)_{0.5}(Co_{1-x}Rh_x)O_2$, where A is an alkaline-earth metal element and x is a numerical value of 0.4 to 0.8. The thermoelectric conversion material of the present invention exhibits good thermoelectric properties over a wide temperature range.

10 Claims, 7 Drawing Sheets

In each graph, the horizontal axis indicates temperature T (K) and the vertical axis indicates electrical resistivity $\rho$ ($\Omega$ cm).

In each graph, the horizontal axis indicates temperature T (K) and the vertical axis indicates Seebeck coefficient S ($\mu$V/K).

THERMOELECTRIC CONVERSION MATERIAL, THERMOELECTRIC CONVERSION ELEMENT USING THE SAME, AND ELECTRONIC DEVICE AND COOLING DEVICE INCLUDING THE THERMOELECTRIC CONVERSION ELEMENT

RELATED APPLICATIONS

This application is a continuation of International Application No. PCT/JP2007/050316, whose international filing date is Jan. 12, 2007 which in turn claims the benefit of Japanese Patent Application No. 2006-008438, filed on Jan. 17, 2006, the disclosures of which Applications are incorporated by reference herein. The benefit of the filing and priority dates of the International and Japanese Applications is respectfully requested.

TECHNICAL FIELD

The present invention relates to a thermoelectric conversion material that converts electric energy and thermal energy mutually through the thermoelectric effect and a thermoelectric conversion element including the same. The present invention also relates to an electronic device utilizing thermoelectric generation provided by the thermoelectric conversion material and a cooling device utilizing thermoelectric cooling.

BACKGROUND ART

Thermoelectric generation is a technology for directly converting thermal energy into electric energy using the Seebeck effect, i.e. a phenomenon that when a temperature difference is given between opposite ends of a substance, thermoelectric power is generated in proportion to the temperature difference. This electric energy can be extracted as electric power, with a load being connected to form a closed circuit. This technology has been used practically, for example, for a remote area power supply, a space power supply, and a military power supply.

The thermoelectric cooling is a technology for causing heat absorption utilizing the Peltier effect, i.e. a phenomenon that when a current is passed through a circuit composed of different substances joined together, heat absorption occurs at one junction and heat generation occurs at the other junction. This effect is considered to be obtained due to the difference between the substances in ratio between a thermal flow and an electric current carried by electrons that flow when two types of substances with carriers whose types are different from each other, such as, for example, a p-type semiconductor and an n-type semiconductor, are connected to each other thermally in parallel and electrically in series. The technology of thermoelectric cooling has been used practically, for example, for local cooling devices for cooling electronic devices used in a space station or wine coolers.

Currently, there is a demand for a thermoelectric conversion material that exhibits good thermoelectric conversion characteristics (thermoelectric performance) over a wide temperature range from room temperature to a high temperature, and various materials, particularly semiconductors, are being studied.

Generally, the thermoelectric performance is evaluated by a figure of merit Z, or a figure of merit ZT that is obtained by multiplying Z by absolute temperature T to be non-dimensionalized. ZT can be expressed as $ZT=S^2/\rho\kappa$, where S is a Seebeck coefficient, $\rho$ is electrical resistivity, and $\kappa$ is thermal conductivity. That is, in order to obtain a thermoelectric conversion material with an excellent thermoelectric performance, a high thermoelectric power, low thermal conductivity, and low electrical resistivity are required. In the conventional thermoelectric conversion materials, however, it cannot always be said that a sufficiently high ZT is obtained. This is because S, $\rho$, and $\kappa$ are basically functions of carrier density and therefore are difficult to vary independently, which results in difficulty in obtaining an optimal solution.

Examples of the thermoelectric conversion materials that have been developed so far include a $Bi_2Te_3$ semiconductor and with this material, a practical-level thermoelectric performance can be obtained at room temperature. Furthermore, materials with complicated structures, such as a skutterudite compound and a clathrate compound, also are being developed so as to be put into practical use.

JP 8(1996)-186294 A (Reference 1) discloses a thermoelectric conversion material represented by a formula $Co_{1-x}M_xSb_3$ (in Reference 1, x is 0.001 to 0.2) in which a part of Co, which is an element constituting a $CoSb_3$ compound having a skutterudite structure, is substituted with at least one element M selected from Pd, Rh, and Ru. However, the thermoelectric conversion material disclosed in Reference 1 has a problem in that it is oxidized in a high temperature range to have a deteriorated thermoelectric performance.

JP 9(1997)-321346 A (Reference 2) and JP 2005-64407 A (Reference 3) each disclose a thermoelectric conversion material, a so-called "$AMO_2$ oxide" (where A is an alkali metal element or an alkaline-earth metal element, and M is Co in Reference 2 and Rh in Reference 3) and describe that such a cobalt oxide and a rhodium oxide exhibit an excellent thermoelectric performance. Furthermore, the thermoelectric conversion materials disclosed in References 2 and 3 each have a structure composed of electrical conducting layers formed of $CoO_2$ or $RhO_2$, and electrical insulating layers disposed between adjacent electrical conducting layers, i.e. a so-called layered bronze structure. This structure does not tend to be destroyed even under high temperature and does not undergo deterioration due to oxidation. Thus those materials are expected to be used in a high temperature range. However, the above-mentioned cobalt oxide and rhodium oxide have metallic properties, i.e. properties that the electrical resistivity increases with an increase in temperature, which may cause those materials to lack in thermoelectric performance in a high temperature range. Furthermore, for example, it is expected that thermoelectric generation in a higher temperature range as compared to the conventional case allows a higher electric energy to be generated. With the thermoelectric conversion material exhibiting metallic properties, however, the electrical resistivity increases with an increase in temperature, which results in an increase in loss.

Denis Pelloquin et al., "Partial substitution of rhodium for cobalt in the misfit $[Pb_{0.7}Co_{0.4}Sr_{1.9}O_3]^{RS}[CoO_2]_{1.8}$ oxide", Journal of Solid State Chemistry, 178 (2005) pp. 769-775 (Reference 4) indicates that when in a cobalt oxide $(Pb_{0.7}Co_{0.4}Sr_{1.9}O_3)(CoO_2)_{1.8}$ with a structure including three electrical insulating layers disposed between electrical conducting layers, which is one of the layered bronze structures, a part of the Co atom is substituted by a Rh atom, semiconducting properties that the electrical resistivity decreases with an increase in temperature (for instance, a temperature derivative of electrical resistivity $d\rho/dT$ is negative) emerge. However, the electrical resistivity $\rho$ of this material is considerably high, specifically at least 1 $\Omega \cdot cm$ (see FIG. 5 of Reference 4), and therefore it cannot always be said to be a suitable thermoelectric conversion material. Moreover, this material contains Pb and therefore has a problem of considerably high burden on the environment.

DISCLOSURE OF INVENTION

Accordingly, the present invention is intended to provide a thermoelectric conversion material that has not only a higher thermoelectric performance than that of a conventional one but also semiconducting properties, i.e. properties that the electrical resistivity decreases with an increase in temperature, which is different from the conventional thermoelectric conversion materials as described above.

A thermoelectric conversion material of the present invention contains a substance having a layered bronze structure represented by a formula $(Bi_2A_2O_4)_{0.5}(Co_{1-x}Rh_x)O_2$, where A is an alkaline-earth metal element and x is a numerical value of 0.4 to 0.8.

Since the thermoelectric conversion material of the present invention has properties that the electrical resistivity decreases with an increase in temperature, i.e. semiconducting properties, the loss caused by the electrical resistance of the material itself can be reduced over a wide temperature range, particularly in a high temperature range. Furthermore, the thermoelectric conversion material of the present invention has a lower electrical resistivity and a higher thermoelectric performance and can have an improved thermoelectric performance over a wide temperature range, particularly in a high temperature range, as compared to not only the thermoelectric conversion material disclosed in Reference 4 but also $(Bi_2A_2O_4)_{0.5}(CoO_2)$ and $(Bi_2A_2O_4)_{0.5}(RhO_2)$. Thus it can be used practically.

The thermoelectric conversion material of the present invention is free from Pb (lead) and therefore can reduce the burden on the environment.

The thermoelectric conversion material of the present invention may be used as, for instance, a thermoelectric conversion element including the material and electrodes that are electrically connected to the material. This element can be a thermoelectric conversion element including, for example, a thermoelectric conversion material of the present invention and a pair of electrodes that are electrically connected to the material.

The thermoelectric conversion element of the present invention can be used, for example, for an electronic device that utilizes the thermoelectric generation function thereof, and a cooling device that utilizes the thermoelectric cooling function thereof. This electronic device can include, for example, a thermoelectric conversion element of the present invention and a load that is electrically connected to the element and is operated by electric power supplied from the element. Furthermore, the cooling device can include, for example, a thermoelectric conversion element of the present invention and a power supply that is electrically connected to the element.

DESCRIPTION OF THE PREFERRED EMBODIMENTS

In the thermoelectric conversion material of the present invention, the element A may contain Ba.

In the thermoelectric conversion material of the present invention, a substance having a layered bronze structure represented by a formula $(Bi_2A_2O_4)_{0.5}(Co_{1-x}Rh_x)O_2$ may be a polycrystal or a single crystal.

In the thermoelectric conversion material of the present invention, the temperature derivative of electrical resistivity (volume resistivity) (dρ/dT) at 300 K may be negative.

The thermoelectric conversion material of the present invention may be in the form of a thin film.

Figure 1:
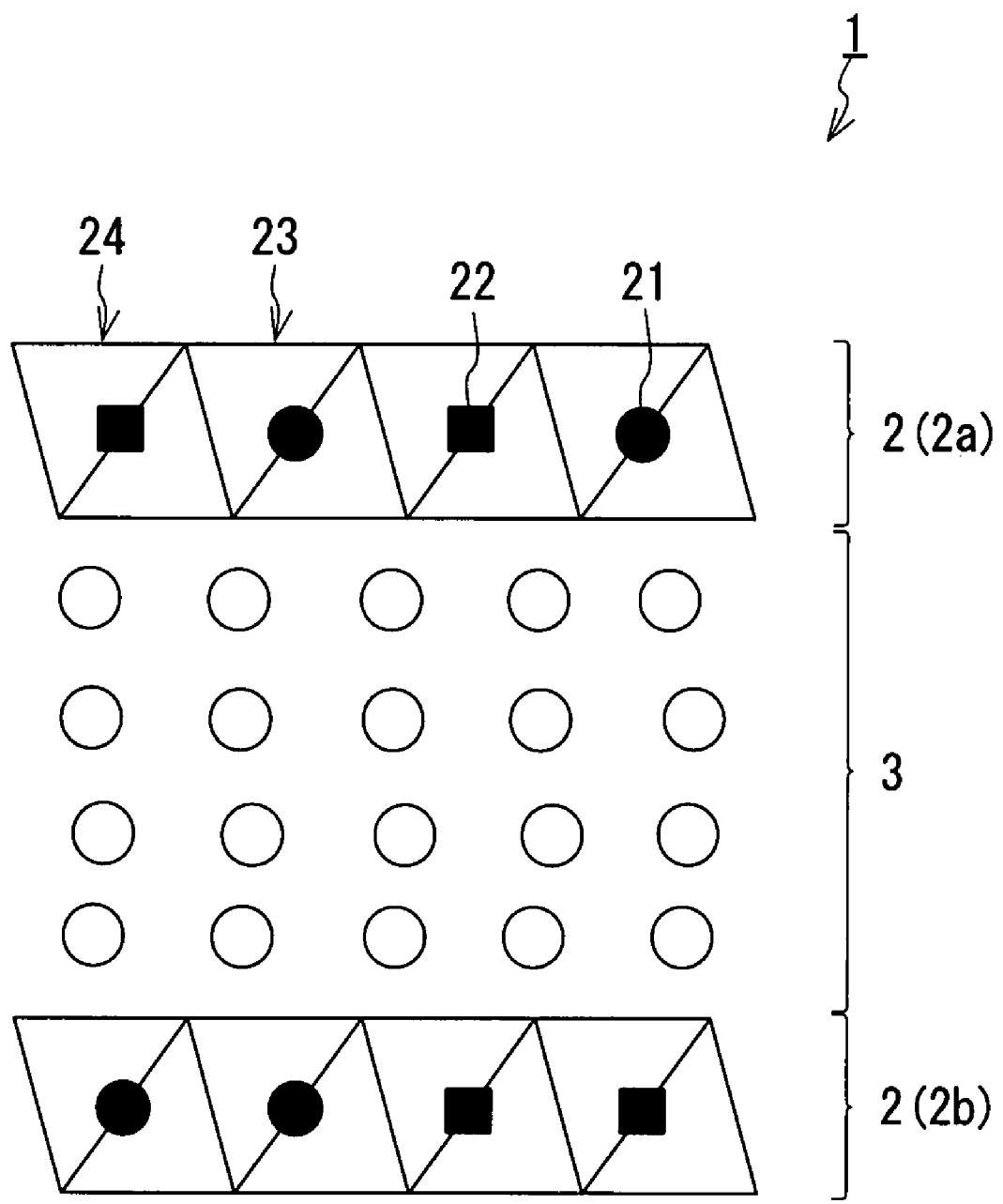
FIG. 1 is a diagram that schematically shows the structure of a thermoelectric conversion material of the present invention.

FIG. 1 schematically shows the structure of a thermoelectric conversion material of the present invention. The thermoelectric conversion material 1 shown in FIG. 1 has a crystal structure in which electrical conducting layers 2 and electrical insulating layers 3 having a rock salt structure are layered alternately in the directions perpendicular to these layers, i.e. a so-called misfit-layered bronze structure. The electrical conducting layers 2 each are composed of $MO_2$ octahedrons that share ridges thereof and are arranged two-dimensionally.

More particularly, in the thermoelectric conversion material 1, the electrical conducting layers 2 each contain both Co (cobalt) 21 indicated with a black circle in FIG. 1 and Rh (rhodium) 22 indicate with a black square in FIG. 1. Co 21 and Rh 22 form a $CoO_2$ octahedron 23 and a $RhO_2$ octahedron 24, respectively. That is, the electrical conducting layers 2 each are composed of $CoO_2$ octahedrons 23 and $RhO_2$ octahedrons 24.

The positions of Co 21 and Rh 22 (the positions of the $CoO_2$ octahedrons 23 and $RhO_2$ octahedrons 24) in the electrical conducting layers 2 are not particularly limited. For example, the $CoO_2$ octahedrons 23 and $RhO_2$ octahedrons 24 may be disposed alternately as in the electrical conducting layer 2a or the octahedrons may be disposed so that the $CoO_2$ octahedrons 23 or $RhO_2$ octahedrons 24 are adjacent to each other as in the electrical conducting layer 2b. It also can be said that the $CoO_2$ octahedrons 23 and the $RhO_2$ octahedrons 24 are positioned randomly in the electrical conducting layers 2.

The ratio between Co and Rh in the thermoelectric conversion material 1 is 0.4 to 0.8 in terms of atomic fraction of Rh with respect to the sum total of Co and Rh. In other words, the electrical conducting layers 2 contain 40 to 80% of $RhO_2$ octahedrons 24 and 60 to 20% of $CoO_2$ octahedrons 23 with respect to all the $MO_2$ octahedrons in the whole thermoelectric conversion material 1.

In the thermoelectric conversion material 1, the electrical insulating layers 3 are composed of four insulating layers formed of Bi (bismuth), an element A (the element A is an alkaline-earth metal element), and O (oxygen), which are indicated with white circles in FIG. 1.

The thermoelectric conversion material 1 as described above has semiconducting temperature dependence, specifically, properties that the electrical resistivity decreases with an increase in temperature, and can reduce the loss caused by the electrical resistance of the material itself over a wide temperature range, particularly in a high temperature range. Furthermore, such a thermoelectric conversion material has a lower electrical resistivity as compared to conventional materials. That is, the thermoelectric conversion material 1 can have an improved thermoelectric performance over a wide temperature range, particularly in a high temperature range and therefore can be used practically, as compared to conventional thermoelectric conversion materials.

With attention focused on the semiconducting temperature dependence, the thermoelectric conversion material of the present invention also can be said to include a semiconducting phase having a layered bronze structure represented by a formula $(Bi_2A_2O_4)_{0.5}(Co_{1-x}Rh_x)O_2$.

Figure 2A:
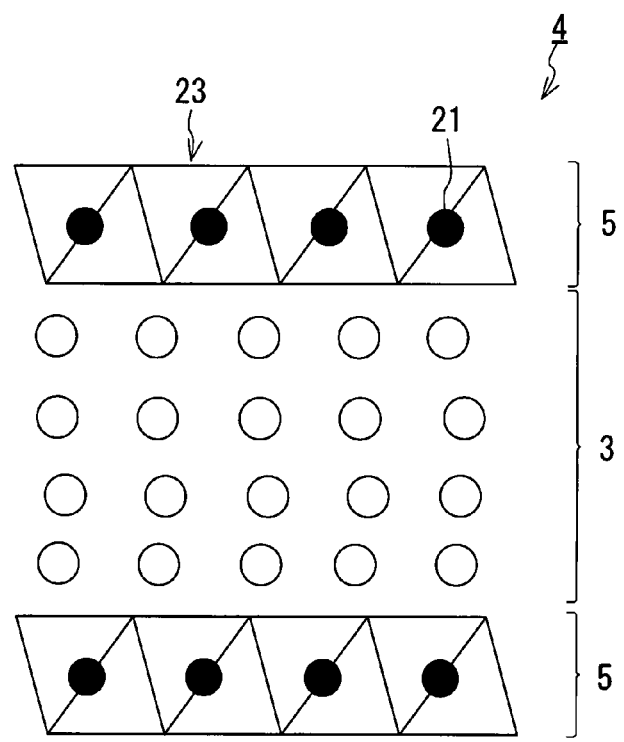
FIG. 2A is a diagram that schematically shows the structure of $(Bi_2A_2O_4)_{0.5}(CoO_2)$.
Figure 2B:
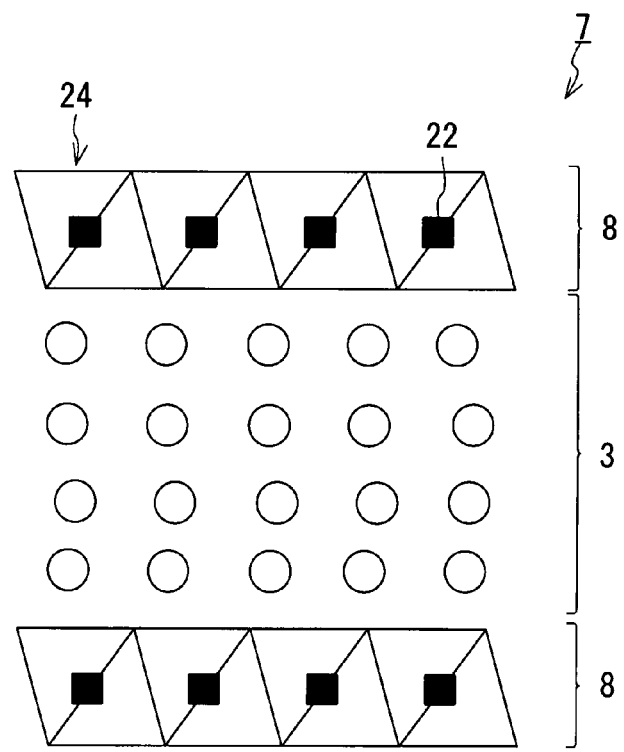
FIG. 2B is a diagram that schematically shows the structure of $(Bi_2A_2O_4)_{0.5}(RhO_2)$.

On the other hand, FIGS. 2A and 2B schematically show the configuration of $(Bi_2A_2O_4)_{0.5}(CoO_2)$ and the configuration of $(Bi_2A_2O_4)_{0.5}(RhO_2)$, which are conventional thermoelectric conversion materials, respectively. The thermoelectric conversion materials 4 and 7 shown in FIGS. 2A and 2B each have a misfit-layered bronze structure in which electrical conducting layers (indicated with numeral 5 in the example shown in FIG. 2A and numeral 8 in the example shown in FIG. 2B) and electrical insulating layers 3 are layered alternately in the direction perpendicular to these layers, as in the thermoelectric conversion material 1 of the present invention. In the thermoelectric conversion material 4 shown in FIG. 2A, the electrical conducting layers 5 each are composed only of $CoO_2$ octahedrons 23, i.e. the element M of the $MO_2$ octahedrons consists of Co 21. In the thermoelectric conversion material 7 shown in FIG. 2B, the electrical conducting layers 8 each are composed only of $RhO_2$ octahedrons 24, i.e. the element M of the $MO_2$ octahedrons consists of Rh 22. The electrical insulating layers 3 shown in FIGS. 2A and 2B are identical to the electrical insulating layer 3 shown in FIG. 1.

The thermoelectric conversion materials shown in FIGS. 2A and 2B have metallic temperature dependence, i.e. properties that the electrical resistivity increases with an increase in temperature.

The thermoelectric conversion material of the present invention has a lower electrical resistivity as compared to the thermoelectric conversion material disclosed in Reference 4 and exhibits a very practical value, specifically not more than one tenth of that of the material disclosed in Reference 4.

Figure 5:
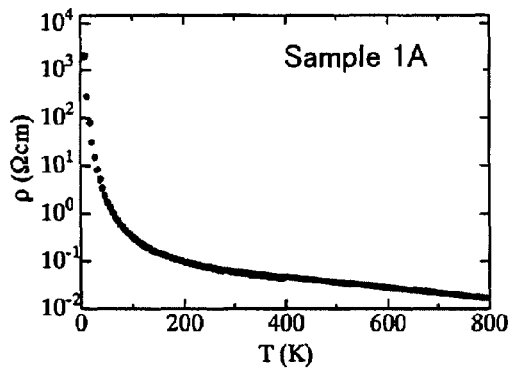
FIG. 5 shows graphs indicating temperature dependence of electrical resistivity of each sample of the examples and comparative examples that were produced in Example 1.
Figure 5:
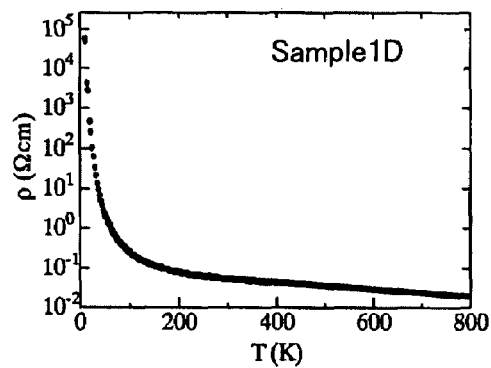
Figure 5:
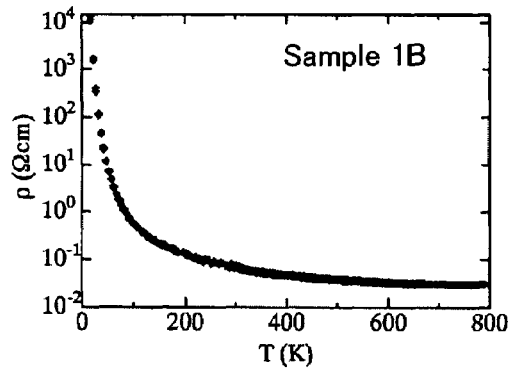
Figure 5:
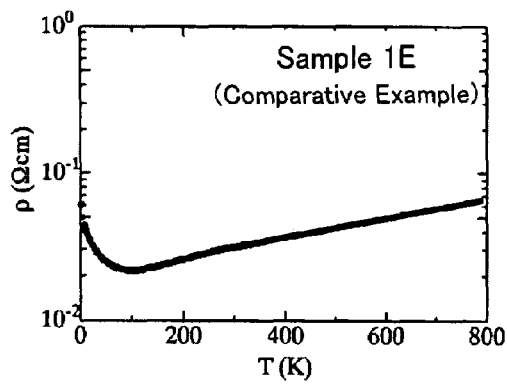
Figure 5:
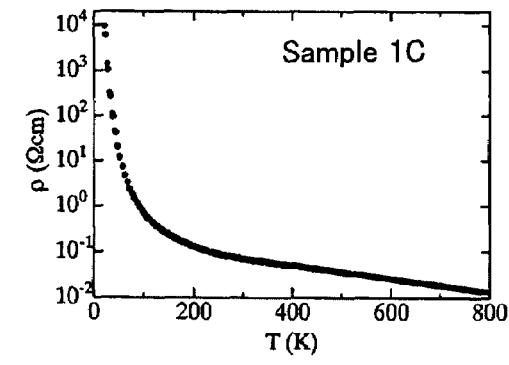
Figure 5:
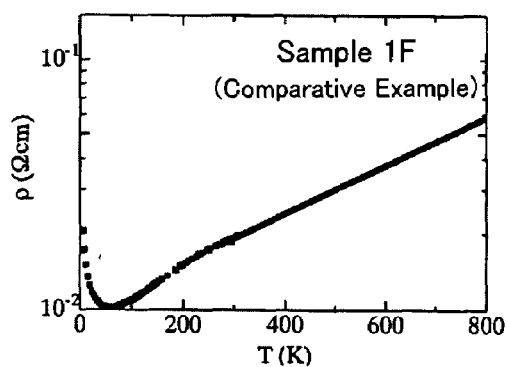

This is described below further in detail. According to FIG. 5 of Reference 4, the electrical resistivity ρ at 300 K is at least 1 ($=10^0$) Ω·cm. On the other hand, as can be seen in FIG. 5 of this application, any of the electrical resistivities ρ at 300 K is not higher than $10^{-1}$ Ω·cm in the present invention. As described above, the electrical resistivity of the thermoelectric conversion material of the present invention is not more than one tenth of that of the thermoelectric conversion material of Reference 4.

It is not clear why the thermoelectric conversion material of the present invention has a lower electrical resistivity as compared to the material disclosed in Reference 4 including three insulating layers between electrical conducting layers although it includes four electrical insulating layers between the electrical conducting layers as shown in FIG. 1. However, the principle as described below can be considered. Conceivably, the insulating layers (Pb, Co, Sr, and O) in the thermoelectric conversion material disclosed in Reference 4 contain Co in which the d electronic state is dominant and Rh with which a part of Co has been substituted, and the Co and Rh atoms in the insulating layers interact with electrons that flow through the $(Co, Rh)O_2$ layers, which are the electrical conducting layers, so that the material disclosed in Reference 4 has a high electrical resistivity. On the other hand, conceivably, since the insulating layers in the thermoelectric conversion material of the present invention are composed of Bi, an element A, and O, the interaction as described above does not occur, and therefore the electrical resistivity thereof is lower than that of the material disclosed in Reference 4.

The present inventors produced seven types of oxides represented by a formula $(Bi_2Ba_2O_4)_{0.5}(Co_{1-x}Rh_x)O_2$, with the value of x being varied (x=0.0, 0.2, 0.4, 0.5, 0.6, 0.8, and 1.0), and they each were evaluated for the temperature derivative of electrical resistivity (dρ/dT) in the vicinity of 300 K as temperature dependence of electrical resistivity in each oxide. The evaluation result is indicated in Table 1 below. The dρ/dT in the vicinity of 300 K of each oxide was obtained by determining the temperature dependence of electrical resistivity of each oxide as in the evaluation method described in the section of Examples, and then mathematically calculating the change in electrical resistivity in the vicinity of 300 K.

TABLE 1

| x | dρ/dT |
|---|---|
| 0.0 | $3.50 \times 10^{-5}$ |
| 0.2 | $6.59 \times 10^{-6}$ |
| 0.4 | $-2.10 \times 10^{-4}$ |
| 0.5 | $-1.06 \times 10^{-4}$ |
| 0.6 | $-3.01 \times 10^{-4}$ |
| 0.8 | $-1.39 \times 10^{-4}$ |
| 1.0 | $5.00 \times 10^{-5}$ |

As indicated in Table 1, when the element M of the $MO_2$ octahedrons in the electrical conducting layers was Co alone (x=0.0) and Rh alone (x=1.0), i.e. when the oxides were $(Bi_2Ba_2O_4)_{0.5}CoO_2$ and $(Bi_2Ba_2O_4)_{0.5}RhO_2$, the value of dρ/dT was positive and the metallic temperature dependence of electrical resistivity (metallic phase) was exhibited. Similarly, when x was 0.2, the value of dρ/dT was positive and the metallic temperature dependence of electrical resistivity was exhibited.

On the other hand, when x was in the range of 0.4 to 0.8, the value of dρ/dT was negative (specifically, $-1.06 \times 10^{-4}$ or lower), and the semiconducting temperature dependence of electrical resistivity was exhibited. That is, it was found that when x was 0.4 to 0.8 in an oxide represented by a formula $(Bi_2A_2O_4)_{0.5}(Co_{1-x}Rh_x)O_2$, a completely new electron phase (semiconducting phase) having semiconducting properties, which was different from the conventional metallic phase, was expressed.

The thermoelectric conversion material of the present invention may contain a component other than the substance having the above-mentioned layered bronze structure, for instance, an element other than the elements forming the above-mentioned layered bronze structure (for instance, may contain an alkali metal element; an alkali metal element such as Na may be contained in the thermoelectric conversion material of the present invention, with a part of the element A being substituted thereby). However, a thermoelectric conversion material is preferred that is formed of the above-mentioned layered bronze structure, i.e. that is formed of a substance represented by the above-mentioned formula $(Bi_2A_2O_4)_{0.5}(Co_{1-x}Rh_x)O_2$, because it allows higher thermoelectric properties to be obtained.

The substance having the above-mentioned bronze structure in the thermoelectric conversion material of the present invention is usually in a crystalline state, and the crystal may be a single crystal or may be a polycrystal. Generally, in the case of a single crystal, higher thermoelectric properties can be obtained, while in the case of a polycrystal, the mass productivity of the thermoelectric conversion material can be improved.

In the thermoelectric conversion material of the present invention, the element A is not particularly limited as long as it is at least one selected from alkaline-earth metal elements, and, for instance, it may be at least one selected from Ca, Sr, and Ba. In this case, a more stable thermoelectric conversion material can be obtained.

Particularly, when the element A includes Ba, the electrical conducting layers and the electrical insulating layers match well with each other and thereby a thermoelectric conversion material with an excellent thermoelectric performance can be obtained.

The content of O (oxygen) in the thermoelectric conversion material of the present invention depends greatly on, for example, the method of producing the material and therefore it is very difficult to specify it precisely. Generally, it is considered that the content of oxygen in the thermoelectric conversion material of the present invention is approximately $1.5 \leq z \leq 2.5$ in terms of the formula $(Bi_2A_2O_4)_{0.5}(Co_{1-x}Rh_x)O_z$. That is, the numerical value "2" indicating the composition ratio of oxygen in a formula $(Bi_2A_2O_4)_{0.5}(Co_{1-x}Rh_x)O_2$ is not exactly "2" but generally denotes the range of about 1.5 to 2.5. In other words, it also can be said that the thermoelectric conversion material of the present invention contains a substance having a layered bronze structure represented by a formula $(Bi_2A_2O_4)_{0.5}(Co_{1-x}Rh_x)O_z$ $(1.5 \leq z \leq 2.5)$.

Similarly, in the present specification, the composition ratio of the $(Bi_2A_2O_4)$ part of the formula $(Bi_2A_2O_4)_{0.5}(Co_{1-x}Rh_x)O_2$ is described as 0.5 for convenience, but this value is a theoretical and ideal value. The value may deviate slightly from 0.5 in the thermoelectric conversion material of the present invention produced actually and may be, for instance, about 0.45 to 0.55. That is, it also can be said that the thermoelectric conversion material of the present invention includes a substance having a layered bronze structure represented by a formula $(Bi_2A_2O_4)_y(Co_{1-x}Rh_x)O_2$ $(0.45 \leq y \leq 0.55)$. Such a thermoelectric conversion material also is embraced in the spirit of the present invention.

The method of producing the thermoelectric conversion material of the present invention is not particularly limited. The thermoelectric conversion material in the form of a thin film can be formed by various thin film growth methods such as vapor deposition methods including a sputtering method and a laser ablation method, vapor-phase growth methods such as a chemical vapor-phase growth method, or formation of a thin film from a liquid phase or a solid phase.

The base material that is used for growing a thin film can be, for example, sapphire ($Al_2O_3$), MgO, $SrTiO_3$, $LaAlO_3$, $NdGaO_3$, $YAlO_3$, $LaSrGaO_4$, $LaSrAlO_4$, $MgAl_2O_4$, ZnO, $ZrO_2$, $TiO_2$, $Fe_2O_3$, $Cr_2O_3$, Si, or GaAs, which has a relatively good lattice matching with the thermoelectric conversion material of the present invention, or can be a single crystal thereof.

A bulk thermoelectric conversion material can be formed by, for example, a solid reaction method, an ionic exchange method, a flux method, or a floating zone method (an FZ method). With these methods, it is possible to form both a single-crystalline thermoelectric conversion material and a polycrystalline thermoelectric conversion material.

Hereinafter, modes for using the thermoelectric conversion material of the present invention are described with reference to the drawings.

Figure 3:
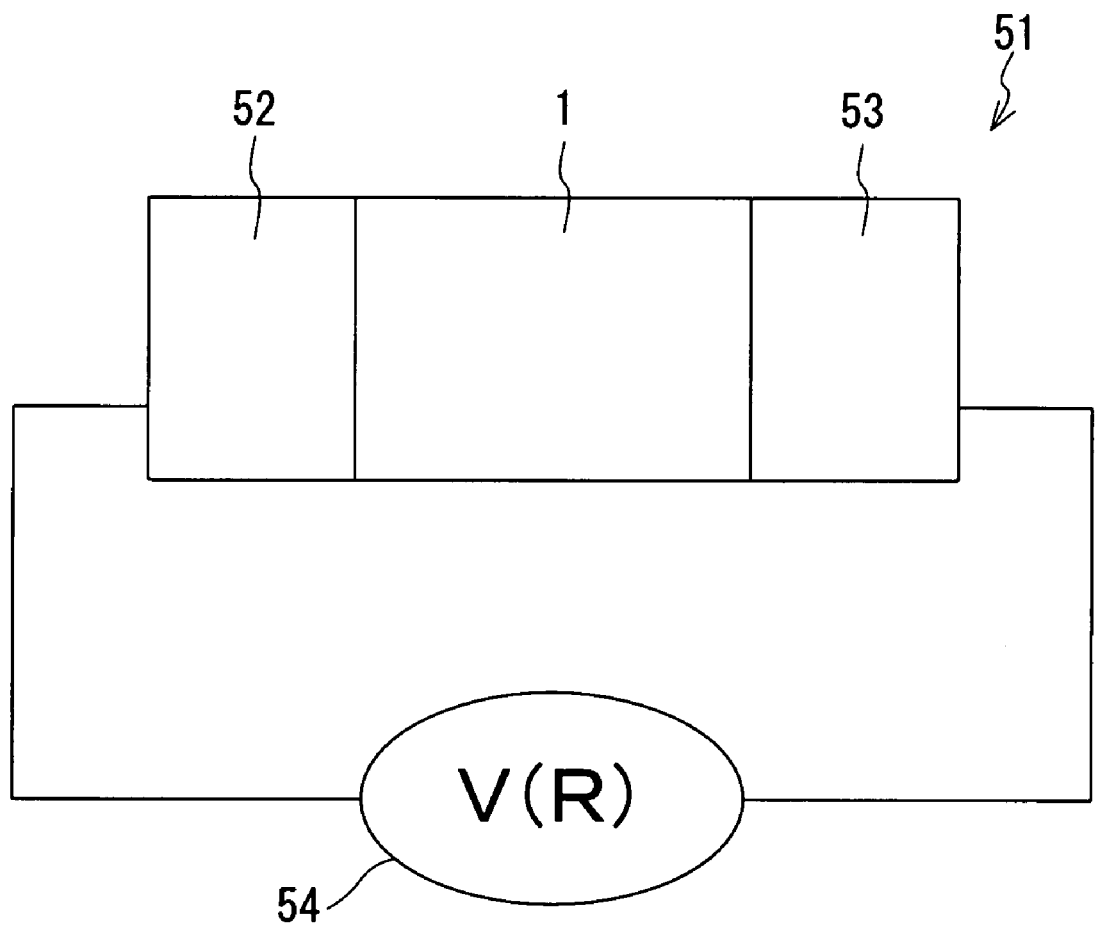
FIG. 3 is a diagram that schematically shows an example of the configuration for using the thermoelectric conversion material of the present invention as a thermoelectric conversion element.

As shown in FIG. 3, the simplest configuration for using the thermoelectric conversion material 1 of the present invention as a thermoelectric conversion element 51 is one in which a pair of electrodes (a first electrode 52 and a second electrode 53) are connected to the thermoelectric conversion material 1 so as to hold it therebetween.

The thermoelectric conversion element 51 can be used as a thermoelectric cooling element that utilizes a Peltier effect when the first electrode 52 and the second electrode 53 are electrically connected to an external DC power supply (V) 54. In this case, either the first electrode 52 or the second electrode 53 serves as a cooling section and the other electrode serves as a heat generating section. When the temperature of the cooling section becomes lower than that of the surroundings, heat is transferred from external parts (for example, articles that are in contact with the cooling section or an atmosphere that is in contact with the cooling section) to the cooling section.

The thermoelectric conversion element 51 can be used as a thermoelectric generation element that utilizes the Seebeck effect when the first electrode 52 and the second electrode 53 are electrically connected to an external load (R) 54. In this case, when either the first electrode 52 or the second electrode 53 is supplied with heat to serve as a hot section and the other electrode is allowed to serve as a cold section, a direct current can be passed through the load 54, i.e. electric power can be supplied to the load 54. In this manner, the thermoelectric conversion element 51 is used in the state of being incorporated in a circuit including a power supply or load 54.

The first electrode 52 and the second electrode 53 are not particularly limited as long as they basically have electrical conductivity. For example, various metal materials such as copper can be used for them.

EXAMPLES

Hereinafter, the present invention is described further in detail using examples. The present invention is not limited to the following examples.

Example 1

Method of Producing Samples

A method of producing thermoelectric conversion material samples (Example Samples 1A to 1D and Comparative Example Samples 1E and 1F) of Example 1 is described. In Example 1, each sample was produced by the solid reaction method. Using the solid reaction method allows the thermoelectric conversion materials to be produced easily at low cost.

First, $Bi_2O_3$, $BaCO_3$, $Co_3O_4$, and $Rh_2O_3$ powders each were weighed as raw materials so that the compositions indicated in Table 2 below were obtained, and then they were mixed together. Thereafter a resultant mixture of the respective powders was baked at 1000° C. for 12 hours. Subsequently, the baked product thus obtained was pulverized once and then was pressed to be formed into a pellet state. This further was baked at 1000° C. for 12 hours. Thus the respective samples of Examples 1A to 1D and Comparative Examples 1E and 1F were produced.

TABLE 2

| Sample | Sample Composition | Output Factor (W/mK$^2$) |
| --- | --- | --- |
| 1A | $(Bi_2Ba_2O_4)_{0.5}(Co_{0.4}Rh_{0.6}O_2)$ | $3.3 \times 10^{-5}$ |
| 1B | $(Bi_2Ba_2O_4)_{0.5}(Co_{0.5}Rh_{0.5}O_2)$ | $4.0 \times 10^{-5}$ |
| 1C | $(Bi_2Ba_2O_4)_{0.5}(Co_{0.6}Rh_{0.4}O_2)$ | $3.1 \times 10^{-5}$ |
| 1D | $(Bi_2Ba_2O_4)_{0.5}(Co_{0.8}Rh_{0.2}O_2)$ | $2.2 \times 10^{-5}$ |
| 1E (Comp. Example) | $(Bi_2Ba_2O_4)_{0.5}(CoO_2)$ | $3.1 \times 10^{-6}$ |
| 1F (Comp. Example) | $(Bi_2Ba_2O_4)_{0.5}(RhO_2)$ | $4.9 \times 10^{-6}$ |

Figure 4:
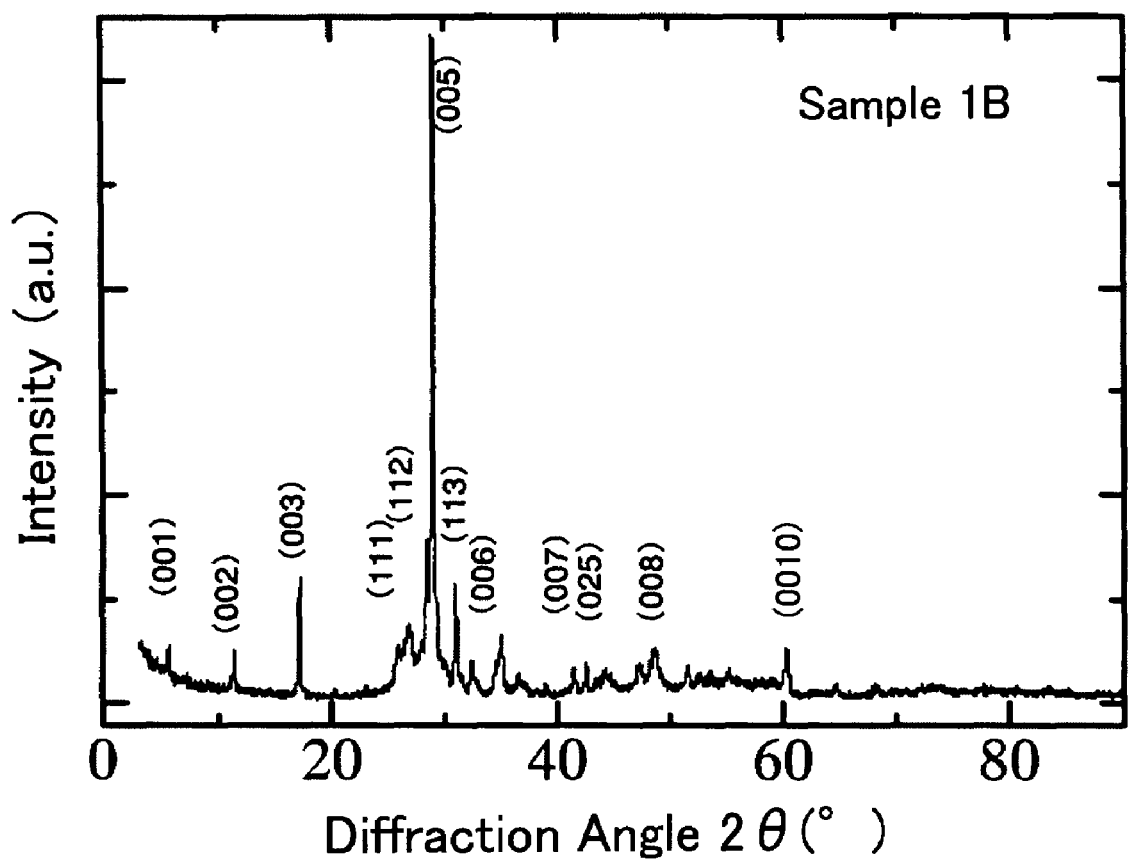
FIG. 4 is a graph showing an X-ray diffraction profile of Example Sample 1B produced in Example 1.

Sample 1B (composition: $(Bi_2Ba_2O_4)_{0.5}(Co_{0.5}Rh_{0.5}O_2)$) was subjected to wide-angle X-ray diffraction (WAXD) measurement. As a result, the diffraction profile shown in FIG. 4 was obtained. From this diffraction profile, it was confirmed that Sample 1B was a single-phase polycrystalline material of $(Bi_2Ba_2O_4)_{0.5}(Co_{0.5}Rh_{0.5}O_2)$.

<Temperature Dependence of Electrical Resistivity>

Each sample produced as described above was measured for the electrical resistivity, with the temperature being varied (in the range of 5 K to 800 K) and the temperature dependence of electrical resistivity was evaluated in each sample. FIG. 5 shows the evaluation result. A DC four terminal method was used for the measurement of the electrical resistivity of each sample. Au electrodes (with a thickness of 400 nm) deposited on each sample by an RF magnetron sputtering method were used as electrodes for measurement. A conducting wire for electrically connecting the Au electrodes and a measuring instrument to each other was fixed to the Au electrodes with a gold paste.

As shown in FIG. 5, in Comparative Example Samples 1E and 1F, the electrical resistivities thereof increased with an increase in temperature in a temperature range of around 60 to 90 K or higher. Thus they exhibited metallic temperature dependence in the temperature range. On the other hand, in Example Samples 1A to 1D, the electrical resistivities thereof decreased with an increase in temperature over the whole range of measurement temperatures. Thus they exhibited semiconducting temperature dependence in temperature over the whole range.

Furthermore, the relationship in magnitude between the electrical resistivity of each example sample and that of each comparative example sample was reversed in the vicinity of around 500 K. Although it also depended on the samples, the electrical resistivities of the example samples were lower than those of the comparative example samples in the temperature range of around 500 K or more.

<Temperature Dependence of Seebeck Coefficient>

Figure 6:
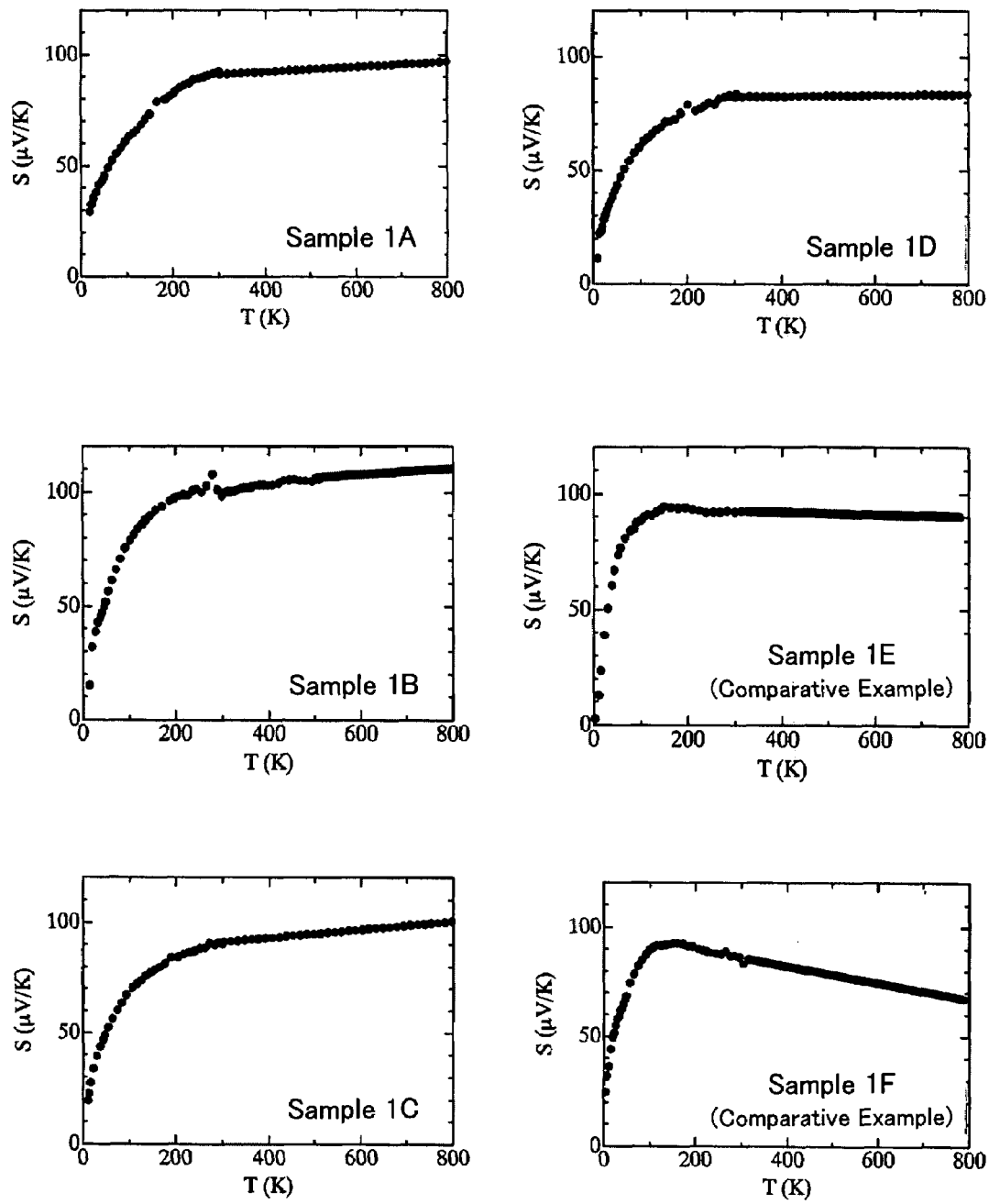
FIG. 6 shows graphs indicating temperature dependence of Seebeck coefficient of each sample of the examples and comparative examples that were produced in Example 1.

Each sample produced as described above was measured for the Seebeck coefficient, with the temperature being varied (in the range of 5 K to 800 K), and thereby the temperature dependence of Seebeck coefficient was evaluated in each sample. FIG. 6 shows the evaluation result. A steady method was used for measuring the Seebeck coefficient, with each sample being processed into a shape with a size of 1 mm×1 mm×7 mm. Au electrodes (with a thickness of 400 nm) deposited on each sample by the RF magnetron sputtering method were used as electrodes for measurement.

As shown in FIG. 6, Comparative Example Samples 1E and 1F exhibited the tendency that the Seebeck coefficients thereof decreased with an increase in temperature in the temperature range of around 100 to 130 K or more. On the other hand, Example Samples 1A to 1D exhibited the tendency that the Seebeck coefficients thereof became constant or increased with an increase in temperature over the whole range of measurement temperatures.

From those results, it was proved that the thermoelectric performance of Samples 1A to 1D was improved considerably as compared to Samples 1E and 1F over a wide temperature range, particularly in a temperature range of 500 K or more where the relationship in magnitude of the electrical resistivity was reversed.

Output factors ($S^2/\rho$) of the respective samples at 800 K are indicated in Table 2 above. As indicated in Table 2, the output factors of Samples 1A to 1D were one order of magnitude larger than those of Samples 1E and 1F, and Samples 1A to 1D were excellent in thermoelectric performance.

Since polycrystalline bulk bodies such as Samples 1A to 1D are relatively easy to produce, they are preferred from the viewpoint of allowing large-capacity thermoelectric elements to be produced.

Example 2

In Example 2, thermoelectric conversion material samples each were produced by the RF magnetron sputtering method using a sapphire substrate. The specific method of producing each sample is described below.

Sample 2A

A $(Bi_2Ba_2O_4)_{0.5}(Co_{0.5}Rh_{0.5}O_2)$ thin film (Sample 2A) with a thickness of 150 nm was formed on a sapphire substrate (with an exposed C plane, 10 mm square, and a thickness of 1 mm) by the RF magnetron sputtering method. The thin film was formed in an oxygen-argon mixture atmosphere (oxygen:argon (partial pressure ratio)=0.25:0.75) with a pressure of 3 Pa using a sintered body formed of $Bi_3Ba_2Rh_{1.5}Co_{1.5}O_z$ ("z" indicates that the oxygen is nonstoichiometric; the same applies to each target described below) as a target, with the sapphire substrate having a temperature of 750° C. and the electric power to be applied being 30W.

The thermoelectric conversion material formed in the form of a thin film as described above not only allows the electrical resistivity thereof to further be lowered but also can be an oriented thermoelectric conversion material.

The composition of Sample 2A formed as described above was evaluated by the energy dispersive X-ray fluorescence spectroscopy (EDS). As a result, the composition was Bi:Ba:Co:Rh (atomic number ratio)=2:2:1:1, and it was confirmed that a $(Bi_2Ba_2O_4)_{0.5}(Co_{0.5}Rh_{0.5}O_2)$ thin film had been formed as Sample 2A.

Figure 7:
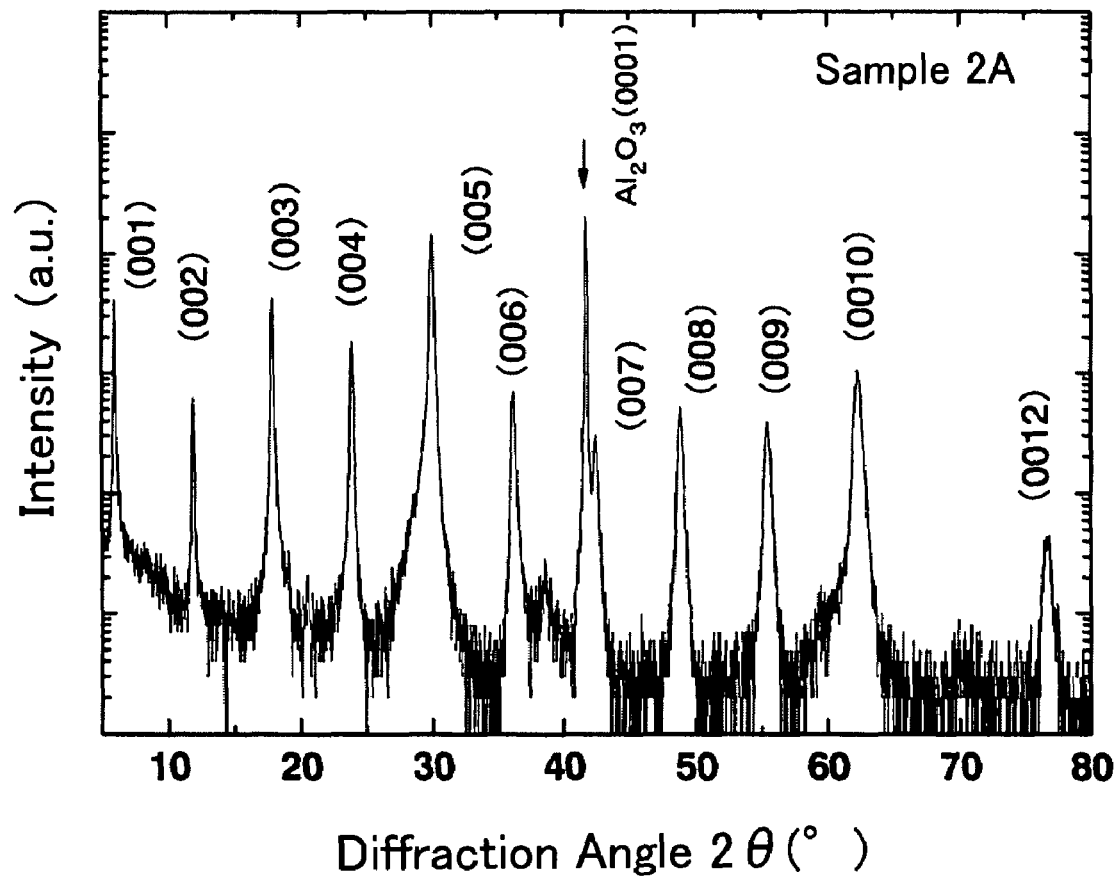
FIG. 7 is a graph showing an X-ray diffraction profile of Example Sample 2A produced in Example 2.

Sample 2A was subjected to the WAXD measurement in the state of being stacked on the sapphire substrate. As a result, the diffraction profile shown in FIG. 7 was obtained. As shown in FIG. 7, peaks corresponding to the (001) plane to the (0012) plane of Sample 2A and a peak (at a diffraction angle 2θ of about 42°, indicated as "$Al_2O_3(0001)$" in FIG. 7) corresponding to the C plane of the sapphire substrate were observed. Thus it was proved that Sample 2A was oriented along the C axis with respect to the crystal structure of the sapphire substrate. Judging from the diffraction profile of Sample 2A, Sample 2A is considered as a single-crystalline body.

Sample 2B

Comparative Example

A $(Bi_2Ba_2O_4)_{0.5}(CoO_2)$ thin film (Sample 2B) with a thickness of 150 nm was formed on a sapphire substrate in the same manner as in Sample 2A except that a sintered body formed of $Bi_3Ba_2Co_3O_z$ was used as a target.

The composition of Sample 2B was evaluated using EDS in the same manner as in Sample 2A. As a result, the composition was Bi:Ba:Co=1:1:1, and it was confirmed that a $(Bi_2Ba_2O_4)_{0.5}(CoO_2)$ thin film had been formed as Sample 2B.

Sample 2B was subjected to the WAXD measurement in the same manner as in Sample 2A. As a result, it was proved that Sample 2B was oriented along the C axis corresponding to the crystal structure of the sapphire substrate.

Sample 2C

Comparative Example

A $(Bi_2Ba_2O_4)_{0.5}(RhO_2)$ thin film (Sample 2C) with a thickness of 150 nm was formed on a sapphire substrate in the same manner as in Sample 2A except that a sintered body formed of $Bi_3Ba_2Rh_3O_z$ was used as a target.

The composition of Sample 2C was evaluated using EDS in the same manner as in Sample 2A. As a result, the composition was Bi:Ba:Rh=1:1:1, and it was confirmed that a $(Bi_2Ba_2O_4)_{0.5}(RhO_2)$ thin film had been formed as Sample 2C.

Sample 2C was subjected to the WAXD measurement in the same manner as in Sample 2A. As a result, it was proved that Sample 2C was oriented along the C axis corresponding to the crystal structure of the sapphire substrate.

Each sample produced as described above was evaluated for temperature dependence of electrical resistivity and temperature dependence of Seebeck coefficient in the same manner as in Example 1. The result thus obtained was similar to that of each example sample and comparative example sample in Example 1. For instance, the relationship in magnitude between the electrical resistivity of the example sample and that of each comparative example sample was reversed in the vicinity of around 500 K, and the electrical resistivity of Sample 2A was lower than those of Comparative Example Samples 2B and 2C in the temperature range of around 500 K or more.

The output factor of Sample 2A, which was expressed by $S^2/\rho$, was $3\times10^{-4}$ (W/mK$^2$) at 800 K and was approximately five times that of Sample 2B and approximately ten times that of Sample 2C of the comparative examples.

Since the single-crystalline body such as Sample 2A has aligned crystal orientation and has no grain boundaries, it can have a higher thermoelectric performance. Such a thermoelectric conversion material is preferred since it allows a thermoelectric conversion element with a higher performance to be produced.

Example 3

In Example 3, thermoelectric conversion material samples were produced by a Travelling-Solvent Floating Zone method (TSFZ method). With this method, a single-crystalline thermoelectric conversion material can be produced. The specific method of producing each sample is described below.

Sample 3A

First, $Bi_2O_3$, $BaCO_3$, $Co_3O_4$, and $Rh_2O_3$ powders each were weighed as raw materials so that a desired composition in terms of stoichiometric ratio was obtained, and then they were mixed together. Thereafter a resultant mixture of the respective powders was baked at 800 to 1000° C. for 12 hours.

Subsequently, the baked product thus obtained was pulverized once and then was pressed to be formed into a bar shape. This further was baked at 800 to 1000° C. for 15 hours. Thus a bar-shaped precursor was formed. Next, the precursor thus formed was subjected to the TSFZ method to be heated and to allow crystals to grow. Thus, single-crystalline $(Bi_2Ba_2O_4)_{0.5}$ $(Co_{0.5}Rh_{0.5}O_2)$ was synthesized (Sample 3A). In the TSFZ method, the crystal growth rate was 0.5 mm/hour, and the reaction atmosphere was an oxygen-argon mixture atmosphere (oxygen:argon (partial pressure ratio)=0.25:0.75).

Sample 3B

Comparative Example

Single-crystalline $(Bi_2Ba_2O_4)_{0.5}(CoO_2)$ was synthesized (Sample 3B) in the same manner as in Sample 3A except that $Rh_2O_3$ powder was not used as a raw material.

Sample 3C

Comparative Example

Single-crystalline $(Bi_2Ba_2O_4)_{0.5}(RhO_2)$ was synthesized (Sample 3C) in the same manner as in Sample 3A except that $Co_2O_4$ powder was not used as a raw material.

Each sample produced as described above was evaluated for temperature dependence of electrical resistivity and temperature dependence of Seebeck coefficient in the same manner as in Example 1. The result thus obtained was similar to that of each example sample and comparative example sample in Example 1. For instance, the relationship in magnitude between the electrical resistivity of the example sample and that of each comparative example sample was reversed in the vicinity of around 500 K, and the electrical resistivity of Sample 3A was lower than that of each of Comparative Example Samples 3B and 3C in the temperature range of about 500 K or more.

The output factor of Sample 3A, which was expressed by $S^2/\rho$, was $4\times10^{-4}$ (W/mK$^2$) at 800 K and was approximately five times that of Sample 3B and approximately ten times that of Sample 3C of the comparative examples.

Since the TSFZ method allows the orientation in a thin-film thermoelectric conversion material to be aligned more easily, a material with an excellent thermoelectric performance can be obtained more reliably. Furthermore, this method is suitable for the formation of microdevices.

Example 4

In Example 4, thermoelectric conversion material samples (Example Samples 4A to 4E and Comparative Example Samples 4F to 4O) were produced by the solid reaction method in the same manner as in Example 1.

The compositions of the respective samples produced as described above are indicated in Table 3 below.

TABLE 3

| Sample | Sample Composition | Output Factor (W/mK$^2$) |
| --- | --- | --- |
| 4A | $(Bi_2BaSrO_4)_{0.5}(Co_{0.5}Rh_{0.5}O_2)$ | $3.5 \times 10^{-5}$ |
| 4B | $(Bi_2BaCaO_4)_{0.5}(Co_{0.5}Rh_{0.5}O_2)$ | $3.2 \times 10^{-5}$ |
| 4C | $(Bi_2SrCaO_4)_{0.5}(Co_{0.5}Rh_{0.5}O_2)$ | $2.0 \times 10^{-5}$ |
| 4D | $(Bi_2Sr_2O_4)_{0.5}(Co_{0.5}Rh_{0.5}O_2)$ | $2.3 \times 10^{-5}$ |
| 4E | $(Bi_2Ca_2O_4)_{0.5}(Co_{0.5}Rh_{0.5}O_2)$ | $1.5 \times 10^{-5}$ |
| 4F (Comp. Example) | $(Bi_2BaSrO_4)_{0.5}(CoO_2)$ | $4.0 \times 10^{-6}$ |

TABLE 3-continued

| Sample | Sample Composition | Output Factor (W/mK$^2$) |
|---|---|---|
| 4G (Comp. Example) | $(Bi_2BaCaO_4)_{0.5}(CoO_2)$ | $3.7 \times 10^{-6}$ |
| 4H (Comp. Example) | $(Bi_2SrCaO_4)_{0.5}(CoO_2)$ | $1.5 \times 10^{-6}$ |
| 4I (Comp. Example) | $(Bi_2Sr_2O_4)_{0.5}(CoO_2)$ | $2.5 \times 10^{-6}$ |
| 4J (Comp. Example) | $(Bi_2Ca_2O_4)_{0.5}(CoO_2)$ | $1.0 \times 10^{-6}$ |
| 4K (Comp. Example) | $(Bi_2BaSrO_4)_{0.5}(RhO_2)$ | $2.6 \times 10^{-6}$ |
| 4L (Comp. Example) | $(Bi_2BaCaO_4)_{0.5}(RhO_2)$ | $2.1 \times 10^{-6}$ |
| 4M (Comp. Example) | $(Bi_2SrCaO_4)_{0.5}(RhO_2)$ | $0.7 \times 10^{-6}$ |
| 4N (Comp. Example) | $(Bi_2Sr_2O_4)_{0.5}(RhO_2)$ | $1.5 \times 10^{-6}$ |
| 4O (Comp. Example) | $(Bi_2Ca_2O_4)_{0.5}(RhO_2)$ | $0.5 \times 10^{-6}$ |

Each sample indicated in Table 3 was evaluated for temperature dependence of electrical resistivity and temperature dependence of Seebeck coefficient in the same manner as in Example 1. The result thus obtained was similar to that of each example sample and comparative example sample in Example 1. For instance, the relationship in magnitude between the electrical resistivity of each example sample and that of each comparative example sample was reversed in the vicinity of around 500 K, and the electrical resistivities of Samples 4A to 4E were lower than those of Comparative Example Samples 4F to 4O in the temperature range of around 500 K or more.

The output factors ($S^2/\rho$) of the respective samples described above at 800 K were indicated in Table 3 above. As indicated in Table 3, the output factors of Samples 4A to 4E were one order of magnitude larger than those of Samples 4F to 4O and thus Samples 4A to 4E were excellent in thermoelectric performance.

INDUSTRIAL APPLICABILITY

As described above, the present invention can provide a thermoelectric conversion material that has not only a higher thermoelectric performance as compared to conventional ones but also semiconducting properties, i.e. properties that the electrical resistivity decreases with an increase in temperature.

The thermoelectric conversion material of the present invention exhibits good thermoelectric properties over a wide temperature range. The thermoelectric conversion material of the present invention has no particular limitation in use thereof with regard to temperature. It is particularly suitable to be used in a high temperature range in, for example, electric generation using waste heat, for instance, in a high temperature range where a part of the thermoelectric conversion material is heated to at least around 500 K.

What is claimed is:

1. A thermoelectric conversion material comprising a substance having a layered bronze structure represented by a formula $(Bi_2A_2O_4)_{0.5}(Co_{1-x}Rh_x)O_2$, where A is an alkaline-earth metal element and x is a numerical value of 0.4 to 0.8.

2. The thermoelectric conversion material according to claim 1, wherein A contains Ba.

3. The thermoelectric conversion material according to claim 1, wherein the substance is a polycrystal.

4. The thermoelectric conversion material according to claim 1, wherein the substance is a single crystal.

5. The thermoelectric conversion material according to claim 1, wherein a temperature derivative of electrical resistivity ($d\rho/dT$) at 300 K is negative.

6. The thermoelectric conversion material according to claim 5, wherein the electrical resistivity at 300 K is $10^{-1}$ $\Omega \cdot cm$ or lower.

7. The thermoelectric conversion material according to claim 1, being in the form of a thin film.

8. A thermoelectric conversion element, comprising:
a thermoelectric conversion material according to claim 1, and
a pair of electrodes connected to the thermoelectric conversion material.

9. An electronic device, comprising:
a thermoelectric conversion element according to claim 8, and
a load that is electrically connected to the thermoelectric conversion element and is operated by electric power supplied from the thermoelectric conversion element.

10. A cooling device, comprising:
a thermoelectric conversion element according to claim 8, and
a power supply that is electrically connected to the thermoelectric conversion element.

* * * * *